United States Patent
Yokota et al.

(10) Patent No.: US 10,900,111 B2
(45) Date of Patent: Jan. 26, 2021

(54) METHOD FOR PRODUCING SURFACE-MODIFIED COMPONENT

(71) Applicant: TOCALO CO., LTD., Kobe (JP)

(72) Inventors: Hiroki Yokota, Akashi Hyogo (JP); Tatsuya Fukushi, Akashi Hyogo (JP); Tatsuo Suidzu, Akashi Hyogo (JP)

(73) Assignee: TOCALO CO., LTD., Kobe (JP)

( * ) Notice: Subject to any disclaimer, the term of this patent is extended or adjusted under 35 U.S.C. 154(b) by 378 days.

(21) Appl. No.: 15/746,795

(22) PCT Filed: Jun. 27, 2016

(86) PCT No.: PCT/JP2016/068957
§ 371 (c)(1),
(2) Date: Jan. 22, 2018

(87) PCT Pub. No.: WO2017/014002
PCT Pub. Date: Jan. 26, 2017

(65) Prior Publication Data
US 2020/0087771 A1 Mar. 19, 2020

(30) Foreign Application Priority Data
Jul. 23, 2015 (JP) .................................. 2015-146236

(51) Int. Cl.
*C23C 4/129* (2016.01)
*C23C 4/08* (2016.01)
*C23C 4/18* (2006.01)

(52) U.S. Cl.
CPC ................ *C23C 4/129* (2016.01); *C23C 4/08* (2013.01); *C23C 4/18* (2013.01)

(58) Field of Classification Search
CPC .................... C23C 4/00–18; C23C 14/5813
See application file for complete search history.

(56) References Cited

U.S. PATENT DOCUMENTS

| | | |
|---|---|---|
| 2002/0177001 A1 | 11/2002 | Harada et al. |
| 2009/0208667 A1 | 8/2009 | Harada et al. |
| | (Continued) | |

FOREIGN PATENT DOCUMENTS

| | | | |
|---|---|---|---|
| CN | 101112701 A | * | 1/2008 |
| CN | 101112701 A | | 1/2008 |
| | (Continued) | | |

OTHER PUBLICATIONS

Examination Report for European Patent Application No. 16827566.7 dated Aug. 2, 2019.

(Continued)

*Primary Examiner* — Dah-Wei D. Yuan
*Assistant Examiner* — Nga Leung V Law
(74) *Attorney, Agent, or Firm* — Womble Bond Dickinson (US) LLP; Joseph Bach, Esq.

(57) ABSTRACT

A method for producing a surface-modified component includes: a process of forming a thermal sprayed coating on a substrate; a process of irradiating a surface of the thermal sprayed coating with a high energy beam so as to cause an entirety of the thermal sprayed coating and a part of the substrate in a thickness direction to melt and then solidify, and thereby forming a densified modified layer; a process of forming a thermal sprayed coating on the modified layer which has been formed in the latest; and a process of irradiating a surface of the thermal sprayed coating with a high energy beam so as to cause an entirety of the thermal sprayed coating and a part of the modified layer which has been formed in the latest in the thickness direction to melt and then solidify, and thereby forming a densified modified layer.

8 Claims, 4 Drawing Sheets

(56) References Cited

U.S. PATENT DOCUMENTS

| | | | | |
|---|---|---|---|---|
| 2010/0279023 | A1* | 11/2010 | Kusinski | C23C 4/08 427/455 |
| 2012/0320601 | A1* | 12/2012 | Motoya | H01L 25/0753 362/296.01 |
| 2014/0302247 | A1* | 10/2014 | Inaba | C23C 4/10 427/493 |

FOREIGN PATENT DOCUMENTS

| | | |
|---|---|---|
| CN | 102424944 A | 4/2012 |
| DE | 102011102602 A1 | 11/2012 |
| GB | 2157600 A | 10/1985 |
| JP | 60-234958 A | 11/1985 |
| JP | 61-235551 A | 10/1986 |
| JP | 05-255832 A | 10/1993 |
| JP | 06-322508 A | 11/1994 |
| JP | 09-170037 A | 6/1997 |
| JP | 2000-054105 A | 2/2000 |
| JP | 2001-164354 A | 6/2001 |
| JP | 2007-247043 A | 9/2007 |

OTHER PUBLICATIONS

Office Action for Chinese Patent Application No. 201680042893.3 dated Apr. 2, 2019.

Jendrzejewski, R., et al., "Temperature distribution in laser-clad multi-layers," Materials Science and Engineering A, vol. 379, No. 1-2, May 2004, pp. 313-320.

Nielsen, S.E., "Laser fusing—a technique for surface improvements," Internet Citation, Aug. 2003, 11 pages. Retrieved from the internet on Mar. 18, 2014: http://www.forcetechnology.com/NR/rdonlyres/B2491257-C355-4367-904A-E8781B54C79F/5302/Laserfusingatechniqueforsurfaceimprovements_web.pdf.

Extended Search Report for European Patent Application No. 16827566.7 dated Nov. 30, 2018.

* cited by examiner

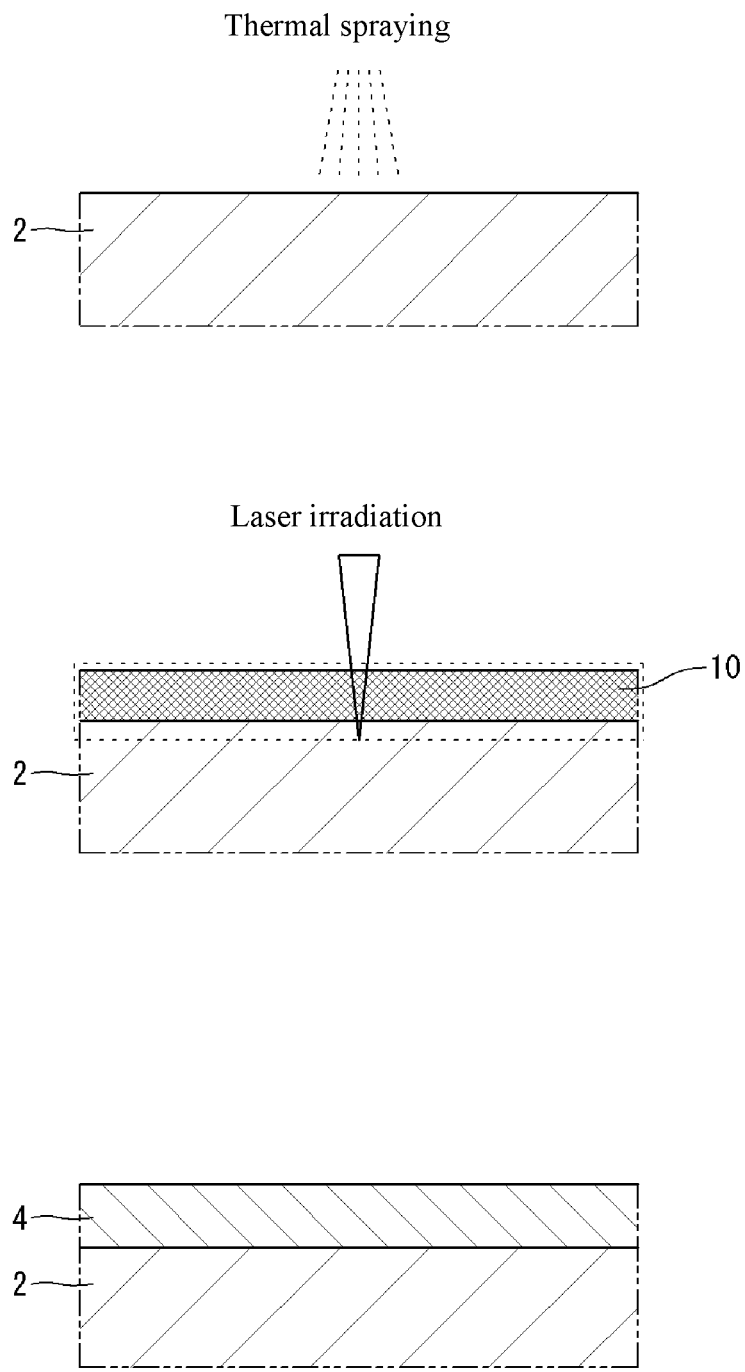
[FIG. 1]

[FIG. 2]
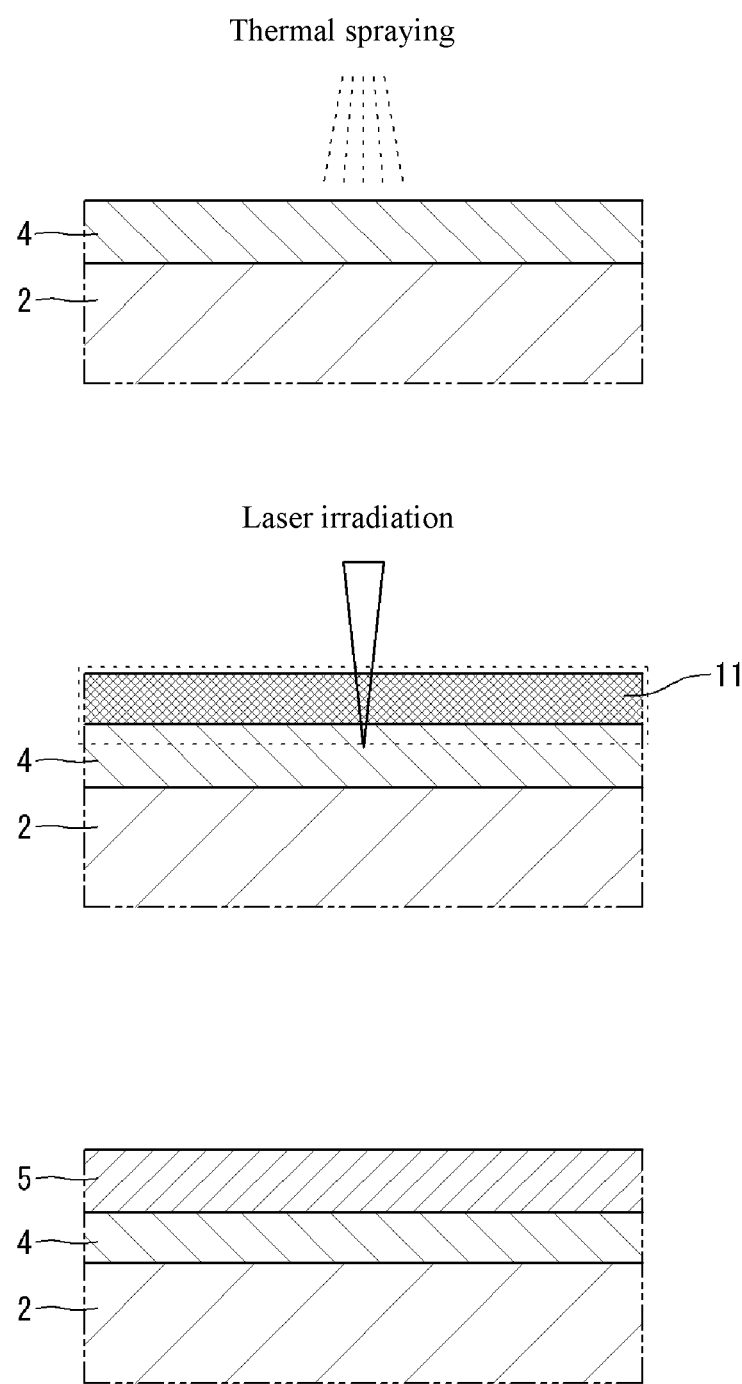

[FIG. 3]
Thermal spraying
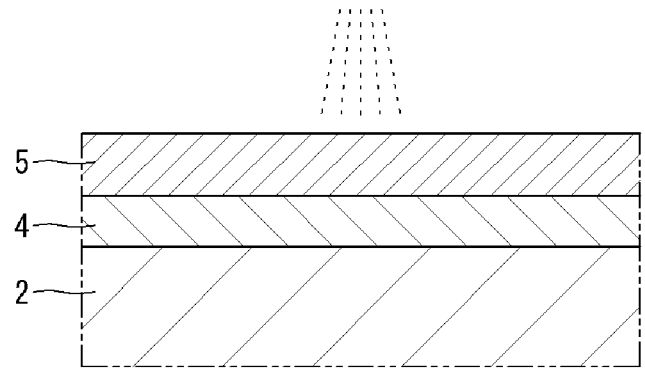
Laser irradiation
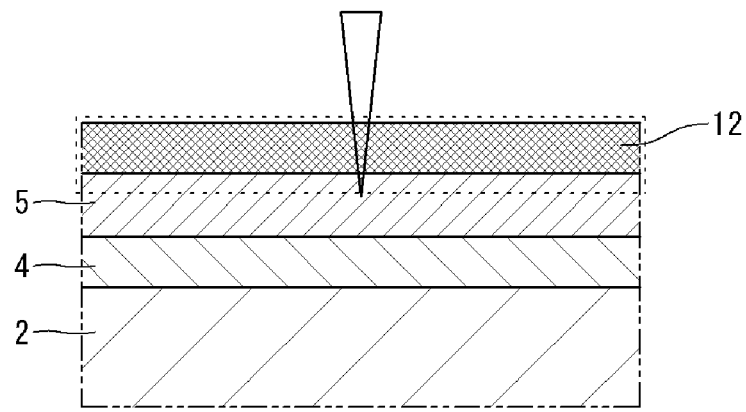
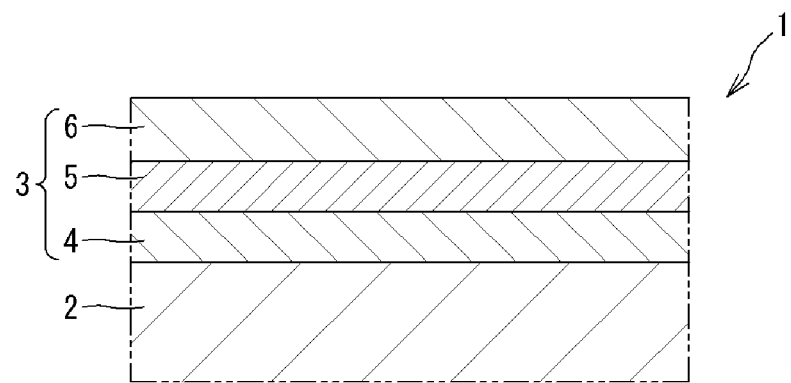

[FIG. 4]
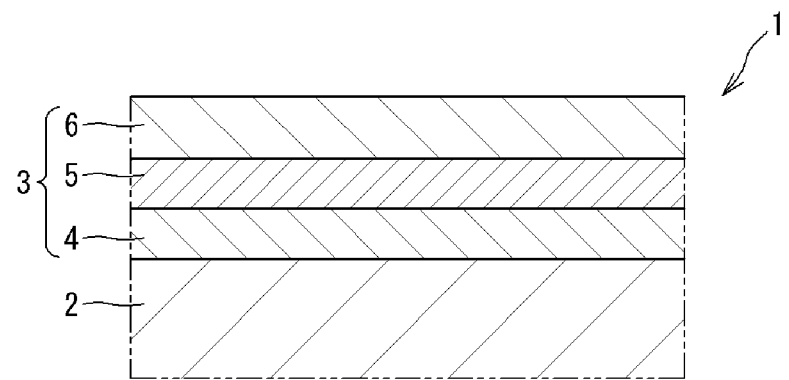
[FIG. 5]
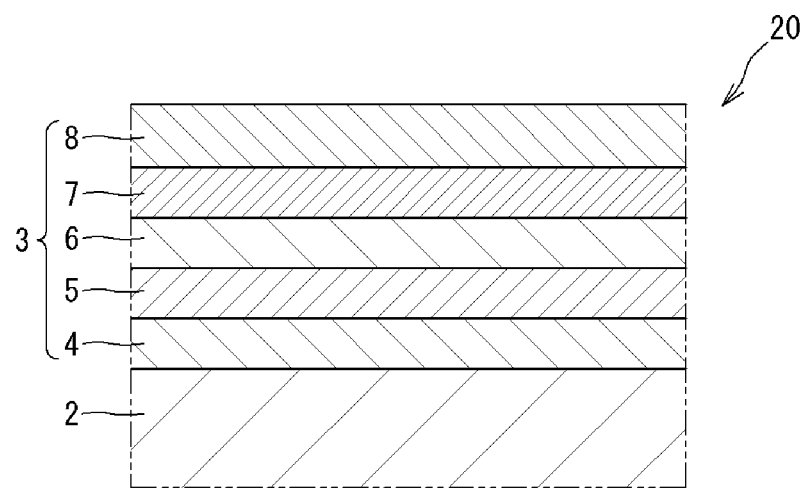

METHOD FOR PRODUCING SURFACE-MODIFIED COMPONENT

RELATED APPLICATIONS

The present application is the national phase of International Application No. PCT/JP2016/068957, filed on Jun. 27, 2016, which claims priority to and the benefit of Japanese Patent Application No. 2015-146236, filed on Jul. 23, 2015, and the disclosures of which are hereby incorporated herein by reference in their entireties.

TECHNICAL FIELD

The present invention relates to a method for producing a surface-modified component, including the steps of: forming a thermal sprayed coating on a substrate; and then irradiating a surface of the thermal sprayed coating with a high energy beam so as to cause the coating to melt and then solidify, and thereby forming a densified modified layer.

BACKGROUND ART

Formation of various types of thermal sprayed coatings is widely carried out for surfaces of constructional components to improve functionality of an outer surface of structures. Methods for thermal spraying involve a surface treatment technique to a surface of a workpiece with a thermal sprayed coating, by feeding thermal spray materials, such as metals, ceramics, and cermets, into combustion flame produced by flammable gas or plasma flame formed by, for example, argon, helium, and hydrogen, and by having the materials softened or melted, and then by spraying the softened or melted materials at a high velocity on the surface of the workpiece.

For example, in the inside of a process chamber in a semiconductor production process, a plasma is generated in a gas containing a fluoride or a chloride and hence a problem is caused that various kinds of components in the process chamber are corroded. Thus, as described in Patent Literature 1, $Y_2O_3$ which is an oxide of a IIIa group element in the periodic table is caused to cover surfaces of the components by thermal spraying so that plasma erosion resistance is improved.

In Patent Literature 2, as an approach for further improvement, an oxide of a IIIa group element in the periodic table is thermal sprayed on a substrate surface so that a porous layer is formed. Then, a surface layer of the porous layer is irradiated with a high energy beam such as a laser beam or the like so that densification is caused and a secondary recrystallized layer is formed, and thereby resistance against a severer corrosive gas atmosphere is obtained.

Further, as another method for modifying a surface layer by irradiation of a high energy beam, a technique disclosed in Patent Literature 3 is known that a thermal sprayed coating serving as an adduct coating is formed in a required area of a surface of an aluminum material and then the thermal sprayed coating is irradiated with a pulsed laser so as to cause the coating to melt, and thereby an alloyed layer or a composited layer is formed from the thermal sprayed coating and the aluminum material.

CITATION LIST

Patent Literature

[Patent Literature 1] Japanese Laid-Open Patent Publication No. 2001-164354

[Patent Literature 2] Japanese Laid-Open Patent Publication No. 2007-247043

[Patent Literature 3] Japanese Laid-Open Patent Publication No. H09-170037

SUMMARY OF INVENTION

Technical Problem

A problem in a coating technique employing thermal spraying is adhesion property between the substrate and the thermal sprayed coating. In the method of Patent Literature 2, the surface layer alone of the thermal sprayed coating is caused to melt by a laser and then caused to solidify so that a recrystallized layer is formed. Thus, although the plasma erosion resistance can be improved, the adhesion property between the substrate and the thermal sprayed coating cannot be improved.

On the other hand, in the method of Patent Literature 3 in which an alloyed layer is formed from the substrate and the thermal sprayed coating, although the adhesion property is improved, the energy of the laser need be excessive when a thick alloyed layer is desired. Nevertheless, this causes a problem that substrate components are excessively contained in the coating so that desired surface performances are not achieved.

An object of the present invention is thus, in consideration of problems in the conventional techniques, to provide a method for producing a surface-modified component in which a modified layer having a high adhesion property to the substrate and having an increased coating thickness can be obtained in a state that interblending of the substrate components is reduced.

Solution to Problem

The method for producing a surface-modified component of the present invention includes the steps of: performing the following process (a) and process (b) in this order; and then performing the following process (c) and process (d) once in this order or, alternatively, plural times in this order. These processes are, (a): a process of forming, on a substrate including a material of a metal, an alloy, or a cermet, a thermal sprayed coating including a material of a metal, an alloy, or a cermet different from the material of the substrate, (b): a process of irradiating a surface of the thermal sprayed coating which has been formed by the process (a) with a high energy beam so as to cause an entirety of the thermal sprayed coating and a part of the substrate in a thickness direction to melt and then solidify, and thereby forming a densified modified layer, (c): a process of forming, on the modified layer which has been formed in the latest, a thermal sprayed coating including a material of a metal, an alloy, or a cermet different from the material of the substrate, and (d): a process of irradiating a surface of the thermal sprayed coating which has been formed by the process (c) with a high energy beam so as to cause an entirety of the thermal sprayed coating and a part of the modified layer which has been formed in the latest in a thickness direction to melt and then solidify, and thereby forming a densified modified layer.

More detailed features of the method for producing a surface-modified component of the present invention are described in the following (1) to (7).

(1) A thermal conductivity of the thermal sprayed coating which has been formed by the process (a) is lower than a thermal conductivity of the substrate.

(2) A thermal conductivity of the thermal sprayed coating which has been formed by the process (c) is lower than a thermal conductivity of the modified layer which has been formed in the latest.

(3) At least one of the thermal sprayed coatings formed by the method has a thermal conductivity of 20 W/(m·K) or lower.

(4) At least one of the thermal sprayed coatings formed by the method has a coating thickness of 50-300 μm.

(5) At least one of the thermal sprayed coatings formed by the method includes a material different from a material of at least one of the other thermal sprayed coatings.

(6) At least one of the thermal sprayed coatings formed by the method includes a material identical to a material of at least one of the other thermal sprayed coatings.

(7) The high energy beam is a laser beam and an energy density thereof is $1.0 \times 10^2 - 1.0 \times 10^4$ J/cm$^2$.

Advantageous Effects of Invention

According to the present invention, by irradiation of a high energy beam, the thermal sprayed coating serving as the outermost layer and the layer immediately thereunder are caused to simultaneously melt so that a modified layer adhering firmly can be formed. At the time of irradiation of a high energy beam, the substrate is not caused to melt in the process of the second and subsequent times. Thus, the substrate components become more diluted as going to a more upper layer. Such a modified layer can be formed thick.

BRIEF DESCRIPTION OF DRAWINGS

FIG. 1 is a process chart showing each stage of a process (a) and a process (b).

FIG. 2 is a process chart showing each stage of a process (c) and a process (d) of the first time.

FIG. 3 is a process chart showing each stage of a process (c) and a process (d) of the second time.

FIG. 4 is a schematic sectional view showing a surface-modified component after a process (d) of the second time has been completed.

FIG. 5 is a schematic sectional view showing a surface-modified component after a process (d) of the fourth time has been completed.

DESCRIPTION OF EMBODIMENTS

One embodiment of a method for producing a surface-modified component of the present invention is described below. FIGS. 1-3 are process charts showing each stage of the embodiment described below. The individual processes in FIGS. 1-3 are sequentially performed in the order from top to bottom.

First, as shown in FIG. 1, a thermal sprayed coating 10 is formed on a substrate 2 by thermal spraying (process (a)). Then, a surface of the first thermal sprayed coating 10 is irradiated with a high energy beam. At that time, an entirety of the first thermal sprayed coating 10 and a part of the substrate 2 in a thickness direction are caused to melt and then solidify. Thus, a densified first modified layer 4 is formed on the substrate 2 (process (b)).

Then, as shown in FIG. 2, a second thermal sprayed coating 11 is formed on the first modified layer 4 (modified layer which has been formed in the latest) by thermal spraying (process (c)). Then, a surface of the second thermal sprayed coating 11 is irradiated with a high energy beam. At that time, an entirety of the second thermal sprayed coating 11 and a part of the first modified layer 4 in the thickness direction are caused to melt and then solidify. Thus, a new second modified layer 5 is formed on the first modified layer 4 (process (d)).

Then, as shown in FIG. 3, a third thermal sprayed coating 12 is formed on the second modified layer 5 (modified layer which has been formed in the latest) by thermal spraying (process (c)). Then, a surface of the third thermal sprayed coating 12 is irradiated with a high energy beam. At that time, with the high energy beam, an entirety of the third thermal sprayed coating 12 and a part of the second modified layer 5 in the thickness direction are caused to melt and then solidify. Thus, a new third modified layer 6 is formed on the second modified layer 5 (process (d)).

As shown in FIG. 4, a surface-modified component 1 produced by the above-mentioned processes is constructed from: the substrate 2; and a covering layer 3 composed of a plurality of the modified layers 4, 5, and 6 for covering the surface of the substrate 2.

The substrate 2 is made of a metal, an alloy, or a cermet. The kind of the metal, the alloy, or the cermet is not limited to a particular one. Employable ones include: a metal element selected from the group consisting of Ni, Cr, Co, Cu, Al, Ta, Y, W, Nb, V, Ti, B, Si, Mo, Zr, Fe, Hf, and La; and an alloy containing one or more of those metal elements. Preferably employed ones include: a stainless steel; a metal element selected from the group consisting of Al, Cu, Ni, Cr, and Mo; and an alloy containing one or more of those metal elements. As described later, it is preferable that the material of the substrate 2 is appropriately selected in consideration of a thermal conductivity of the first thermal sprayed coating 10 to be formed on the substrate 2. The substrate 2 is not limited to a bulk material itself and may be a coating formed on a bulk material.

The first to the third thermal sprayed coatings 10, 11, and 12 are composed of a metal, an alloy, or a cermet. Employable methods for forming the first to the third thermal sprayed coatings 10, 11, and 12 include atmospheric plasma spraying, low pressure plasma spraying, high velocity flame spraying, gas flame spraying, arc spraying, and detonation spraying. Among these, in the high velocity flame spraying, oxidation reactions at the time of thermal spraying can be reduced so that a relatively densified thermal sprayed coating is formed. Thus, when melting is performed in the subsequent process, a remarkably satisfactory modified layer is formed. On the other hand, for materials whose coating formation is difficult or for substrates whose coating formation is difficult by the high velocity flame spraying, the atmospheric plasma spraying may be employed so that coating formation can easily be achieved. Then, when melting is performed, a sufficiently satisfactory modified layer can be formed. Also in the other methods for thermal spraying, a satisfactory modified layer is formed when coating conditions or melting conditions in the subsequent process are adjusted.

The first to the third modified layers 4, 5, and 6 are all formed by irradiation of a high energy beam on the surface of a thermal sprayed coating. By this process, a modified layer having a more densified structure than a thermal sprayed coating not having undergone this process can be formed so that wear resistance and corrosion resistance can be improved.

By irradiation of a high energy beam in the process (b), in addition to the first thermal sprayed coating 10, a part of the substrate also is simultaneously caused to melt and then solidify. As a result, the substrate 2 and the first modified layer 4 firmly adhere together.

By irradiation of a high energy beam in the process (d) of the first time, in addition to the second thermal sprayed coating 11, a part of the first modified layer 4 also is simultaneously caused to melt and then solidify. As a result, the first modified layer 4 and the second modified layer 5 firmly adhere together.

By irradiation of a high energy beam in the process (d) of the second time, in addition to the third thermal sprayed coating 12, a part of the second modified layer 5 also is simultaneously caused to melt and then solidify. As a result, that the second modified layer 5 and the third modified layer 6 firmly adhere together.

As seen from the above description, according to the present embodiment, the surface-modified component 1 is obtained, in which the individual layers from the substrate 2 to the third modified layer 6 serving as the uppermost layer firmly adhere together.

In the process (b) and the process (d), the high energy beam is irradiated such as not to reach the substrate 2. Thus, in the covering layer 3 composed of a plurality of the modified layers 4, 5, and 6, the content of components of the substrate 2 (substrate components) decreases as going from the substrate 2 side to the surface side.

In the present embodiment, when the process (c) and the process (d) are repeated further, the densified modified layer can be formed in an increased coating thickness. Specifically, the process (c) and the process (d) may be repeated three or more times, for example, seven to ten times or the like. Alternatively, the process (c) and the process (d) may be performed only once.

In the present embodiment, the material constituting the substrate 2 and the material constituting the first to the third thermal sprayed coatings 10, 11, and 12 are individually a metal, an alloy, or a cermet. The material constituting the substrate 2 is different from each of the materials constituting the thermal sprayed coatings 10, 11, and 12.

The materials constituting the first to the third thermal sprayed coatings 10, 11, and 12 may all be the same as each other or may all be different from each other. Alternatively, among the first to the third thermal sprayed coatings, a part of the coatings may be formed from different materials from each other and the other thermal sprayed coatings may be formed from the same material. Specifically, (i) the materials of the first and the second thermal sprayed coatings 10 and 11 may be the same as each other and the material of the third thermal sprayed coating 12 alone may be different from these. Alternatively, (ii) the materials of the first and the third thermal sprayed coatings 10 and 12 may be the same as each other and the material of the second thermal sprayed coating 11 alone may be different from these. Further, (iii) the materials of the second and the third thermal sprayed coatings 11 and 12 may be the same as each other and the material of the first thermal sprayed coating 10 alone may be different from these.

In a case that materials different from each other are employed in the individual thermal sprayed coatings, a stack of modified layers individually formed from different materials and firmly adhering together is formed on the substrate. In a case that the same material is employed, a modified layer formed from one kind of material and having an increased coating thickness is formed on the substrate.

Regardless of whether the materials of the individual thermal sprayed coatings are different from each other or the same as each other, a large merit in practice is obtained by a construction in which a modified layer having an increased coating thickness covers the substrate and a layered construction in which interblending of the components derived from the substrate (substrate components) into the uppermost surface is reduced. Thus, coatings in wide variations in accordance with an application object can be formed.

The present embodiment has been described for an example that the high energy beam irradiated on each thermal sprayed coating 10, 11, or 12 is a laser beam. Instead, an electron beam or the like may be employed. The irradiation conditions of the high energy beam are suitably adjusted in consideration of the thickness, the porosity, the substrate components dilution ratio, and the like required in the modified layer 4, 5, or 6. For example, in a case that an energy density is set to be $1.0 \times 10^2 - 1.0 \times 10^4$ J/cm$^2$, the melting of the substrate 2, or the melting of the first modified layer 4 and the second modified layer 5, which have been formed in the latest, is achieved satisfactorily so that the covering layer 3 having a high adhesion property between layers is easily formed. Thus, this condition is preferable.

Employable kinds of the laser in the present embodiment include: a fiber laser, a semiconductor laser, and a YAG laser. Employable modes of oscillation of the laser include continuous oscillation and pulsed oscillation. A continuous oscillation mode is preferable because heat can be imparted more continuously to the thermal sprayed coating.

A beam shape at the focal point of the laser may suitably be set to be rectangular, circular, or the like. Scanning of the laser may be performed linearly in a state that the focal point is fixed. Alternatively, the scanning may be performed linearly in a state that the focal point is tracing a circle or an ellipse. The laser head side may be caused to scan or the substrate side may be caused to scan. In addition to these conditions, in consideration of also the thermal conductivity of the thermal sprayed coating which is to be irradiated with the laser, the irradiation conditions are suitably set up.

Specifically employable metals or alloys for constituting the first to the third thermal sprayed coatings 10, 11, and 12 include: a metal element selected from the group consisting of Ni, Cr, Co, Cu, Al, Ta, Y, W, Nb, V, Ti, B, Si, Mo, Zr, Fe, Hf, and La; and an alloy containing one or more of those metal elements. Preferably employed ones include: an alloy containing one or more of metal elements selected from the group consisting of Ni, Cr, Co, Al, Y, and Mo; and Si. Employable cermets are those obtained by compositing one or more of ceramics selected from the group consisting of $Cr_3C_2$, TaC, WC, NbC, VC, TiC, $B_4C$, SiC, $CrB_2$, WB, MoB, $ZrB_2$, $TiB_2$, $FeB_2$, CrN, $Cr_2N$, TaN, NbN, VN, TiN, and BN with one or more of metals selected from the group consisting of Ni, Cr, Co, Cu, Al, Ta, Y, W, Nb, V, Ti, B, Si, Mo, Zr, Fe, Hf, and La.

When the surface of the first thermal sprayed coating 10 is irradiated with the laser, in a case that the thermal conductivity of the first thermal sprayed coating 10 is higher than the thermal conductivity of the substrate 2, thermal diffusion from the first thermal sprayed coating 10 to the substrate 2 easily occurs. Thus, a larger energy becomes necessary in the melting of the thermal sprayed coating so that the melting of the substrate 2 tends to be excessive relative to the expectation. In order that this situation may be avoided, it is preferable that the thermal conductivity of the first thermal sprayed coating 10 is lower than the thermal conductivity of the substrate 2. When the thermal conductivity of the thermal sprayed coating is lower than the thermal conductivity of the substrate, the thermal diffusion to the substrate is suppressed so that the thermal sprayed coating is easily caused to melt and the substrate is not caused to excessively melt.

Similarly, when the surface of the second thermal sprayed coating 11 is irradiated with the laser, in a case that the thermal conductivity of the second thermal sprayed coating 11 is higher than the thermal conductivity of the first modified layer 4, thermal diffusion from the second thermal sprayed coating 11 to the first modified layer 4 easily occurs. Thus, a larger energy becomes necessary in the melting of the thermal sprayed coating so that the melting of the first modified layer 4 tends to be excessive relative to the expectation. When the surface of the third thermal sprayed coating 12 is irradiated with the laser, in a case that the thermal conductivity of the third thermal sprayed coating 12 is higher than the thermal conductivity of the second modified layer 5, thermal diffusion from the third thermal sprayed coating 12 to the second modified layer 5 easily occurs. Thus, a larger energy becomes necessary in the melting of the thermal sprayed coating so that the melting of the second modified layer 5 tends to be excessive relative to the expectation. In order that these situations may be avoided, it is preferable that the thermal conductivity of the second thermal sprayed coating 11 is lower than the thermal conductivity of the first modified layer 4. Further, it is preferable that the thermal conductivity of the third thermal sprayed coating 12 is lower than the thermal conductivity of the second modified layer 5. When the thermal conductivity of the thermal sprayed coating is lower than the thermal conductivity of the modified layer which has been formed in the latest, the thermal diffusion to the modified layer is suppressed so that the thermal sprayed coating is easily caused to melt and the modified layer is not caused to excessively melt.

It is preferable that the thermal conductivities of the first to the third thermal sprayed coatings 10, 11, and 12 are individually 20 W/(m·K) or lower. Further, 15 W/(m·K) or lower is more preferable and 10 W/(m·K) or lower is still more preferable.

The thermal conductivity (W/(m·K)) may be calculated by using a method that the thermal diffusivity (m$^2$/s) is measured by a method according to JIS H 7801:2005 "Method For Measuring Thermal Diffusivity Of Metals By The Laser Flash Method" and then the following formula is applied.

Thermal conductivity $k$ (W/(m·K))=Thermal diffusivity $a$ (m$^2$/s)×Specific heat $c$ (J/(K·kg))×Density $\rho$(kg/m$^3$)

The thermal conductivity of the thermal sprayed coating is set up suitably depending on thermal spraying conditions, combination of the intrinsic thermal conductivities of thermal spray materials, and the like. The intrinsic thermal conductivities of metals and alloys may be obtained from Metal Data Book, 3rd revised edition (edited by The Japan Institute of Metals and Materials) or the like.

For example, the first to the third thermal sprayed coatings 10, 11, and 12 can be formed to have a coating thickness of 10-500 µm, preferably 50-300 µm. When the coating thicknesses of the first to the third thermal sprayed coatings 10, 11, and 12 are set to be 50-300 µm, the melting of the substrate 2, or the melting of the first modified layer 4 and the second modified layer 5, which have been formed in the latest, is achieved satisfactorily so that the covering layer 3 having a high adhesion property between layers is easily obtained.

At the time that the first to the third thermal sprayed coatings 10, 11, and 12 melt and then solidify, although contraction somewhat occurs, their coating thicknesses do not largely vary. Thus, the coating thicknesses of the first to the third modified layers 4, 5, and 6 are respectively almost the same as the coating thicknesses of the first to the third thermal sprayed coatings 10, 11, and 12.

According to the present embodiment, the porosities of the first to the third modified layers 4, 5, and 6 can be 3% or lower, preferably 1% or lower. Thus, physical and chemical properties such as the wear resistance and the corrosion resistance are improved. The porosity may be measured by a method that a cross section of the thermal sprayed coating is observed by using a scanning electron microscope (SEM) and then binarization process is performed on the cross sectional photograph so that a black area in the inside the coating is regarded as a pore and then the fraction of the black area relative to the entirety is calculated.

According to the present embodiment, for example, the substrate components can be diluted to 10-50% by one time of laser irradiation. When it is assumed that the substrate components are diluted to 30% by one time of laser irradiation, theoretically, the content of the substrate components in the first modified layer 4 becomes 30%, then the content of the substrate components in the second modified layer 5 becomes 9%, and then the content of the substrate components in the third modified layer 6 becomes 2.7%. Then, when this operation is repeated, the substrate components are diluted further in a multiplier manner. Thus, with increasing number of layers, a surface-modified layer having a decreasing content of the substrate components can be obtained. The content of the substrate components in the modified layer serving as the uppermost layer is preferably lower than 10%, more preferably lower than 5%, and still more preferably lower than 1%. When the content of the substrate components becomes lower than 1%, the obtained modified layer may be regarded as almost the same as a modified layer obtained by irradiating a thermal sprayed coating completely not containing the substrate components with a high energy beam.

As such, the first to the third modified layers 4, 5, and 6 having been densified are formed on the substrate 2. In a case that a larger thickness of the modified layer is required, formation of a thermal sprayed coating and irradiation of a high energy beam on the surface of the thermal sprayed coating may be repeated further. When the process (c) and the process (d) are repeated twice more for the surface-modified component 1 shown in FIG. 4, a surface-modified component 20 shown in FIG. 5 is obtained that includes: a substrate 2; and a covering layer 3 composed of a first to a fifth modified layers 4, 5, 6, 7, and 8 formed on the substrate 2. That is, in a case that "n" modified layers are to be formed on the substrate, it is sufficient that the process (a) and the process (b) are performed and then the process (c) and the process (d) are repeated in this order in "n−1" times (n>1; n is an integer).

According to the present embodiment, the thickness of the covering layer composed of a plurality of modified layers formed on the substrate can be 3.0 mm or greater in total.

The method for producing a surface-modified component according to the present embodiment may include another processes other than the above-mentioned processes (a) to (d). For example, after the above-mentioned process (d), a post process such as a grinding process may be performed on the uppermost surface. Further, at the time of or before forming a thermal sprayed coating, a process of preheating the substrate or the modified layers may be included when necessary.

EXAMPLES

Examples in which the present invention is applied and comparative examples corresponding thereto are described below.

Example 1

A bulk material made of stainless steel (SUS 304), having a size of 100 mm square×10 mm, was prepared as a substrate. As a thermal spray material, Co-based alloy (Stellite No. 21) powder was adopted. A thermal sprayed coating for a first layer was formed in a coating thickness of 150 μm on the substrate by high velocity flame spraying. The thermal sprayed coating for a first layer was irradiated with a continuous oscillation laser (CW) at an energy density of 3000 J/cm$^2$ so that the entirety of the thermal sprayed coating for a first layer and a part of the substrate were caused to melt and then cooling-solidify. Thus, a densified modified layer as the first layer was obtained. Then, as a thermal spray material, the same Co-based alloy (Stellite No. 21) powder as the material of the first layer was adopted. A thermal sprayed coating for a second layer was formed in a coating thickness of 150 μm above the substrate by high velocity flame spraying to the modified layer as the first layer. The thermal sprayed coating for a second layer was irradiated with a continuous oscillation laser (CW) at an energy density of 3000 J/cm$^2$ so that the entirety of the thermal sprayed coating for a second layer and a part of the modified layer as the first layer were caused to melt and then cooling-solidify. Thus, a densified modified layer as the second layer was obtained. Then, as a thermal spray material, the same Co-based alloy (Stellite No. 21) powder as the material of the first layer was adopted. A thermal sprayed coating for a third layer was formed in a coating thickness of 150 μm on the modified layer as the second layer by high velocity flame spraying to the modified layer as the second layer. The thermal sprayed coating for a third layer was irradiated with a continuous oscillation laser (CW) at an energy density of 3000 J/cm$^2$ so that the entirety of the thermal sprayed coating for a third layer and a part of the modified layer as the second layer were caused to melt and then cooling-solidify. Thus, a densified modified layer as the third layer was obtained. The above-mentioned operation was repeated so that a surface-modified component of Example 1 was produced.

Example 2

A surface-modified component of Example 2 was produced by the same method as Example 1 except that the energy density of the continuous oscillation laser (CW) was set to be 1000 J/cm$^2$ and that the coating thickness of each thermal sprayed coating was set to be 50 μm.

Example 3

A surface-modified component of Example 3 was produced by the same method as Example 1 except that the energy density of the continuous oscillation laser (CW) was set to be 6000 J/cm$^2$ and that the coating thickness of each thermal sprayed coating was set to be 300 μm.

Example 4

A surface-modified component of Example 4 was produced by the same method as Example 1 except that the energy density of the continuous oscillation laser (CW) was set to be 200 J/cm$^2$ and that the coating thickness of each thermal sprayed coating was set to be 10 μm.

Comparative Example 1

A bulk material made of stainless steel (SUS 304), having a size of 100 mm square×10 mm, was prepared as a substrate. As a thermal spray material, Co-based alloy (Stellite No. 21) powder was adopted. A thermal sprayed coating was formed in a coating thickness of 5 μm on the substrate by high velocity flame spraying. The thermal sprayed coating was irradiated with a continuous oscillation laser (CW) at an energy density of 100 J/cm$^2$. As a result, the thermal sprayed coating melted, but the substrate did not melt so that the thermal sprayed coating aggregated at the time of melting, and thereby the substrate surface was exposed.

Example 5

A surface-modified component of Example 5 was produced by the same method as Example 1 except that the energy density of the continuous oscillation laser (CW) was set to be 9000 J/cm$^2$ and that the coating thickness of each thermal sprayed coating was set to be 450 μm.

Comparative Example 2

A bulk material made of stainless steel (SUS 304), having a size of 100 mm square×10 mm, was prepared as a substrate. As a thermal spray material, Co-based alloy (Stellite No. 21) powder was adopted. A thermal sprayed coating was formed in a coating thickness of 600 μm on the substrate by high velocity flame spraying. The thermal sprayed coating was irradiated with a continuous oscillation laser (CW) at an energy density of 12000 J/cm$^2$. As a result, the thermal sprayed coating melted, but a large number of blowholes were generated on the surface of the thermal sprayed coating, and thereby the substrate surface was exposed.

Example 6

A surface-modified component of Example 6 was produced by the same method as Example 1 except that the energy density of the continuous oscillation laser (CW) was set to be 12000 J/cm$^2$ and that the coating thickness of each thermal sprayed coating was set to be 450 μm.

Example 7

A surface-modified component of Example 7 was produced by the same method as Example 1 except that thermal spraying conditions (specifically, spray distance and temperature of combustion flame) at the time of forming the thermal sprayed coating were controlled so that thermal sprayed coatings having a thermal conductivity different from Example 1 were formed.

Example 8

A surface-modified component of Example 8 was produced by the same method as Example 1 except that Ni-based alloy (Hastelloy C276) was used for the substrate.

Comparative Example 3

A bulk material made of Ni-based alloy (Hastelloy C276), having a size of 100 mm square×10 mm, was prepared as a substrate. As a thermal spray material, Co-based alloy (Stellite No. 21) powder was adopted. A thermal sprayed coating was formed in a coating thickness of 150 µm on the substrate by high velocity flame spraying. The thermal sprayed coating was irradiated with a continuous oscillation laser (CW) at an energy density of 3000 J/cm$^2$. As a result, the thermal sprayed coating melted, but thermal diffusion to the substrate occurs and the substrate did not melt so that the thermal sprayed coating having melted aggregated, and thereby a part of the substrate surface was exposed.

Example 9

A surface-modified component of Example 9 was produced by the same method as Example 1 except that Ni-based alloy (NiCrAlY) powder was adopted as a thermal spray material for forming a thermal sprayed coating for a third layer.

Example 10

A surface-modified component of Example 10 was produced by the same method as Example 1 except that Ni-based alloy (NiCrAlY) powder was adopted as a thermal spray material for forming a thermal sprayed coating for a second layer.

Example 11

A surface-modified component of Example 11 was produced by the same method as Example 1 except that Ni-based alloy (NiCrAlY) powder was adopted as a thermal spray material for forming a thermal sprayed coating for a first layer.

Example 12

A bulk material made of Al, having a size of 100 mm square×10 mm, was prepared as a substrate. As a thermal spray material, Si powder was adopted. A thermal sprayed coating for a first layer was formed in a coating thickness of 100 µm on the substrate by atmospheric plasma spraying. The thermal sprayed coating for a first layer was irradiated with a continuous oscillation laser (CW) at an energy density of 2000 J/cm$^2$ so that the entirety of the thermal sprayed coating for a first layer and a part of the substrate were caused to melt and then cooling-solidify. Thus, a densified modified layer as the first layer was obtained. Then, as a thermal spray material, the same Si powder as the material of the first layer was adopted. A thermal sprayed coating for a second layer was formed in a coating thickness of 100 µm above the substrate by atmospheric plasma spraying to the modified layer as the first layer. The thermal sprayed coating for a second layer was irradiated with a continuous oscillation laser (CW) at an energy density of 2000 J/cm$^2$ so that the entirety of the thermal sprayed coating for a second layer and a part of the modified layer as the first layer were caused to melt and then cooling-solidify. Thus, a densified modified layer as the second layer was obtained. Then, as a thermal spray material, the same Si powder as the material of the first layer was adopted. A thermal sprayed coating for a third layer was formed in a coating thickness of 100 µm on the modified layer as the second layer by atmospheric plasma spraying to the modified layer as the second layer. The thermal sprayed coating for a third layer was irradiated with a continuous oscillation laser (CW) at an energy density of 2000 J/cm$^2$ so that the entirety of the thermal sprayed coating for a third layer and a part of the modified layer as the second layer were caused to melt and then cooling-solidify. Thus, a densified modified layer as the third layer was obtained. The above-mentioned operation was repeated so that a surface-modified component of Example 12 was produced.

Example 13

A surface-modified component of Example 13 was produced by the same method as Example 1 except that Ni-based alloy (Hastelloy C276) was used for the substrate.

Example 14

A bulk material made of Cu, having a size of 100 mm square×10 mm, was prepared as a substrate. As a thermal spray material, Ni-based alloy (NiCrAlY) powder was adopted. A thermal sprayed coating for a first layer was formed in a coating thickness of 100 µm on the substrate by atmospheric plasma spraying. The thermal sprayed coating for a first layer was irradiated with a continuous oscillation laser (CW) at an energy density of 2500 J/cm$^2$ so that the entirety of the thermal sprayed coating for a first layer and a part of the substrate were caused to melt and then cooling-solidify. Thus, a densified modified layer as the first layer was obtained. Then, as a thermal spray material, Ni-based alloy (NiCrAlY) powder was adopted. A thermal sprayed coating for a second layer was formed in a coating thickness of 100 µm above the substrate by atmospheric plasma spraying to the modified layer as the first layer. The thermal sprayed coating for a second layer was irradiated with a continuous oscillation laser (CW) at an energy density of 2500 J/cm$^2$ so that the entirety of the thermal sprayed coating for a second layer and a part of the modified layer as the first layer were caused to melt and then cooling-solidify. Thus, a densified modified layer as the second layer was obtained. Then, as a thermal spray material, Ni-based alloy (NiCrAlY) powder was adopted. A thermal sprayed coating for a third layer was formed in a coating thickness of 100 µm on the modified layer as the second layer by atmospheric plasma spraying to the modified layer as the second layer. The thermal sprayed coating for a third layer was irradiated with a continuous oscillation laser (CW) at an energy density of 2500 J/cm$^2$ so that the entirety of the thermal sprayed coating for a third layer and a part of the modified layer as the second layer were caused to melt and then cooling-solidify. Thus, a densified modified layer as the third layer was obtained. The above-mentioned operation was repeated so that a surface-modified component of Example 14 was produced.

Example 15

A material made of stainless steel (SUS 304), having a size of 100 mm square×10 mm, was prepared as a substrate. As a thermal spray material, $Cr_3C_2$ cermet ($Cr_3C_2$—NiCr)

powder was adopted. A thermal sprayed coating for a first layer was formed in a coating thickness of 100 μm on the substrate by high velocity flame spraying. The thermal sprayed coating for a first layer was irradiated with a continuous oscillation laser (CW) at an energy density of 1500 J/cm$^2$ so that the entirety of the thermal sprayed coating for a first layer and a part of the substrate were caused to melt and then cooling-solidify. Thus, a densified modified layer as the first layer was obtained. Then, as a thermal spray material, $Cr_3C_2$ cermet ($Cr_3C_2$—NiCr) powder was adopted. A thermal sprayed coating for a second layer was formed in a coating thickness of 100 μm above the substrate by high velocity flame spraying to the modified layer as the first layer. The thermal sprayed coating for a second layer was irradiated with a continuous oscillation laser (CW) at an energy density of 1500 J/cm$^2$ so that the entirety of the thermal sprayed coating for a second layer and a part of the modified layer as the first layer were caused to melt and then cooling-solidify. Thus, a densified modified layer as the second layer was obtained. Then, as a thermal spray material, $Cr_3C_2$ cermet ($Cr_3C_2$—NiCr) powder was adopted. A thermal sprayed coating for a third layer was formed in a coating thickness of 100 μm on the modified layer as the second layer by high velocity flame spraying to the modified layer as the second layer. The thermal sprayed coating for a third layer was irradiated with a continuous oscillation laser (CW) at an energy density of 1500 J/cm$^2$ so that the entirety of the thermal sprayed coating for a third layer and a part of the modified layer as the second layer were caused to melt and then cooling-solidify. Thus, a densified modified layer as the third layer was obtained. The above-mentioned operation was repeated so that a surface-modified component of Example 15 was produced.

As described above, the individual components of Examples 1-15 and Comparative Examples 1-3 were completed. Table 1 summarizes the evaluation results of the individual components of Examples 1-15 and Comparative Examples 1-3. At the time that the thermal sprayed coating for a first layer has been formed, the surface condition of the coating was visually observed. The second and subsequent layers were formed and then the surface condition was visually observed after ten or more layers have been stacked. Each of the thermal conductivities of the thermal sprayed coatings and the modified layers in Table 1 was obtained by the following method. That is, after a thermal sprayed coating produced by using the same material under the same thermal spraying conditions and another sample further having undergone laser irradiation were prepared, their thermal diffusivities were individually measured by a laser flash method and then the thermal conductivities were individually calculated. Each of the contents of the substrate components was obtained by the following method. That is, after another sample in which modified layers up to the third layer have been formed under the same conditions was prepared, elemental analysis was performed on the cross section of the sample by using an EDS (energy dispersive X-ray analysis device) of an SEM and then the contents were measured. In a case that the substrate is made of an alloy or a cermet, with focusing attention on a particular element, the content of the substrate components was calculated from the amount of change in the amount of that element.

TABLE 1

| | | Thermal spray material | | | | Thermal conductivity (W/(m · K)) | | |
|---|---|---|---|---|---|---|---|---|
| | | | | | | First layer (Before laser irradiation/ After laser irradiation) | Second layer (Before laser Irradiation/ After laser irradiation) | Third layer (Before laser Irradiation/ After laser irradiation) |
| No. | Substrate | First layer | Second layer | Third layer | Substrate | | | |
| Ex. 1 | Stainless steel | Co-based alloy | Co-based alloy | Co-based alloy | 16.3 | 6.5/14.2 | 6.5/14.2 | 6.5/14.2 |
| Ex. 2 | Stainless steel | Co-based alloy | Co-based alloy | Co-based alloy | 16.3 | 6.5/14.2 | 6.5/14.2 | 6.5/14.2 |
| Ex. 3 | Stainless steel | Co-based alloy | Co-based alloy | Co-based alloy | 16.3 | 6.5/14.2 | 6.5/14.2 | 6.5/14.2 |
| Ex. 4 | Stainless steel | Co-based alloy | Co-based alloy | Co-based alloy | 16.3 | 6.5/14.2 | 6.5/14.2 | 6.5/14.2 |
| Com. Ex. 1 | Stainless steel | Co-based alloy | — | — | 16.3 | 6.5/— | — | — |
| Ex. 5 | Stainless steel | Co-based alloy | Co-based alloy | Co-based alloy | 16.3 | 6.5/14.2 | 6.5/14.2 | 6.5/14.2 |
| Com. Ex. 2 | Stainless steel | Co-based alloy | — | — | 16.3 | 6.5/— | — | — |
| Ex. 6 | Stainless steel | Co-based alloy | Co-based alloy | Co-based alloy | 16.3 | 6.5/14.2 | 6.5/14.2 | 6.5/14.2 |
| Ex. 7 | Stainless steel | Co-based alloy | Co-based alloy | Co-based alloy | 16.3 | 10.6/15.1 | 10.6/15.1 | 10.6/15.1 |

| No. | Laser processing Energy density (J/cm$^2$) | Thermal spraying Coating thickness (μm) | First layer ○: Coating formation was possible. Δ: Coating formation was possible, but defects occurred partially. X: Coating formation was impossible. | Content of substrate components after formation of layers up to third layer ⊚: Less than 5% ○: Less than 20% Δ: 20% or more | Surface condition after stacking of ten or more layers ○: Fine X: Poor |
|---|---|---|---|---|---|
| Ex. 1 | 3000 | 150 | ○ | ⊚ | ○ |
| Ex. 2 | 1000 | 50 | ○ | ⊚ | ○ |
| Ex. 3 | 6000 | 300 | ○ | ⊚ | ○ |
| Ex. 4 | 200 | 10 | ○ | ○ | ○ |

TABLE 1-continued

| | | | | | |
|---|---|---|---|---|---|
| Com. Ex. 1 | 100 | 5 | X (Exposure of substrate) | — | — |
| Ex. 5 | 9000 | 450 | Δ (Generation of blowhole) | ◎ | X (Owing to blowhole) |
| Com. Ex. 2 | 12000 | 600 | X (Exposure of substrate) | — | — |
| Ex. 6 | 12000 | 450 | Δ (Generation of blowhole) | Δ | X (Owing to blowhole) |
| Ex. 7 | 3000 | 150 | ○ | ◎ | ○ |

| | | Thermal spray material | | | | Thermal conductivity (W/(m·K)) | | |
|---|---|---|---|---|---|---|---|---|
| | | | | | | First layer (Before laser irradiation/ After laser irradiation) | Second layer (Before laser Irradiation/ After laser irradiation) | Third layer (Before laser Irradiation/ After laser irradiation) |
| No. | Substrate | First layer | Second layer | Third layer | Substrate | | | |
| Ex. 8 | Ni-based alloy | Co-based alloy | Co-based alloy | Co-based alloy | 10.5 | 6.5/14.2 | 6.5/14.2 | 6.5/14.2 |
| Com Ex. 3 | Ni-based alloy | Co-based alloy | — | — | 10.5 | 12.3/— | — | — |
| Ex. 9 | Stainless steel | Co-based alloy | Co-based alloy | Ni-based alloy | 16.3 | 6.5/14.2 | 6.5/14.2 | 6.1/10.4 |
| Ex. 10 | Stainless steel | Co-based alloy | Ni-based alloy | Co-based alloy | 16.3 | 6.5/14.2 | 6.1/10.4 | 6.5/14.2 |
| Ex. 11 | Stainless steel | Ni-based alloy | Co-based alloy | Co-based alloy | 16.3 | 6.1/10.4 | 6.5/14.2 | 6.5/14.2 |
| Ex. 12 | Al | Si | Si | Si | 204.0 | 9.7/89.3 | 9.7/89.3 | 9.7/89.3 |
| Ex. 13 | Ni-based alloy | Si | Si | Si | 11.2 | 9.7/89.3 | 9.7/89.3 | 9.7/89.3 |
| Ex. 14 | Cu | Ni-based alloy | Ni-based alloy | Ni-based alloy | 391.0 | 6.1/10.4 | 6.1/10.4 | 6.1/10.4 |
| Ex. 15 | Stainless steel | $Cr_3C_2$ cermet | $Cr_3C_2$ cermet | $Cr_3C_2$ cermet | 16.3 | 5.8/21.4 | 5.8/21.4 | 5.8/21.4 |

| No. | Laser processing Energy density (J/cm²) | Thermal spraying Coating thickness (μm) | First layer ○: Coating formation was possible. Δ: Coating formation was possible, but defects occurred partially. X: Coating formation was impossible. | Content of substrate components after formation of layers up to third layer ◎: Less than 5% ○: Less than 20% Δ: 20% or more | Surface condition after stacking of ten or more layers ○: Fine X: Poor |
|---|---|---|---|---|---|
| Ex. 8 | 3000 | 150 | ○ | ◎ | ○ |
| Com Ex. 3 | 3000 | 150 | X (Exposure of substrate) | — | — |
| Ex. 9 | 3000 | 150 | ○ | ◎ | ○ |
| Ex. 10 | 3000 | 150 | ○ | ◎ | ○ |
| Ex. 11 | 3000 | 150 | ○ | ◎ | ○ |
| Ex. 12 | 2000 | 100 | ○ | ◎ | ○ |
| Ex. 13 | 2000 | 100 | ○ | ◎ | ○ |
| Ex. 14 | 2500 | 100 | ○ | ◎ | ○ |
| Ex. 15 | 1500 | 100 | ○ | ◎ | ○ |

As seen from the above results, in Examples 1-3 and 7-15, a satisfactory covering layer constructed from a stack of a plurality of modified layers was obtained, and the content of the substrate components after stacking of three layers was lower than 5%. According to these, the surface condition was satisfactory even after stacking into ten or more layers.

In Example 4, a satisfactory covering layer constructed from a stack of a plurality of modified layers was obtained, and the content of the substrate components after stacking of three layers was 5% or higher and lower than 20%. In Example 4, when further multilayering into four or more layers is performed, the content of the substrate components can be reduced to lower than 5%. According to Example 4, the surface condition was satisfactory even after stacking into ten or more layers.

In Example 5, a covering layer constructed from a stack of a plurality of modified layers was obtained, and the content of the substrate components after stacking of three layers was lower than 5%. Nevertheless, after laser processing for the first layer, generation of blowhole was observed at several locations. When multilayering into ten or more layers was performed, the generated blowhole in the thermal sprayed coating for a first layer had caused a large blowhole on the surface.

In Example 6, a covering layer constructed from a stack of a plurality of modified layers was obtained, but the content of the substrate components after stacking of three layers was 20% or higher. In the modified layer as the first layer, generation of blowhole was observed at several locations. When multilayering into ten or more layers was performed, the generated blowhole in the thermal sprayed coating for a first layer had caused a large blowhole on the surface.

In Comparative Examples 1-3, as described above, at the time that the modified layer as the first layer was formed, the substrate surface was exposed and hence thermal sprayed coatings for second and subsequent layers were not formed.

INDUSTRIAL APPLICABILITY

The present invention may be effectively utilized in various fields of industry such as automobile industry, semiconductor industry, steel industry, aviation and space industry, and energy industry.

DESCRIPTION OF REFERENCE CHARACTERS

1 Surface-modified component
2 Substrate
3 Covering layer
4 First modified layer
5 Second modified layer
6 Third modified layer
7 Fourth modified layer
8 Fifth modified layer
10 First thermal sprayed coating
11 Second thermal sprayed coating
12 Third thermal sprayed coating
20 Surface-modified component

The invention claimed is:

1. A method for producing a surface-modified component, comprising the steps of: performing the following process (a) and process (b) in this order; and then performing the following process (c) and process (d) once in this order or, alternatively, plural times in this order, wherein
   (a): a process of forming, on a substrate comprising a material of a metal, an alloy, or a cermet, a first thermal sprayed coating comprising a material of a metal, an alloy, or a cermet different from the material of the substrate,
   (b): a process of irradiating the first thermal sprayed coating which has been formed by the process (a) with a high energy beam so as to cause an entirety of the thermal sprayed coating and a part of the substrate in a thickness direction to melt and then solidify, and thereby forming a first densified modified layer having content of substrate material that is 10-50% in the modified layer,
   (c): a process of forming, on the first densified modified layer, a second thermal sprayed coating comprising a material of a metal, an alloy, or a cermet different from the material of the substrate, and
   (d): a process of irradiating the second thermal sprayed coating which has been formed by the process (c) with the high energy beam so as to cause an entirety of the second thermal sprayed coating and a part of the first modified layer in a thickness direction to melt and then solidify, and thereby forming a second densified modified layer having content of substrate material that is 10-50% of the content of substrate material in the first densified modified layer.

2. The method according to claim 1, wherein a thermal conductivity of the first thermal sprayed coating which has been formed by the process (a) is lower than a thermal conductivity of the substrate.

3. The method according to claim 1 or 2, wherein a thermal conductivity of the second thermal sprayed coating which has been formed by the process (c) is lower than a thermal conductivity of the modified layer which has been formed in the latest.

4. The method according to any one of claims 1 to 3, wherein at least one of the thermal sprayed coatings formed by the method has a thermal conductivity of 20 W/(m·K) or lower.

5. The method according to any one of claims 1 to 4, wherein at least one of the thermal sprayed coatings formed by the method has a coating thickness of 50-300 µm.

6. The method according to any one of claims 1 to 5, wherein at least one of the thermal sprayed coatings formed by the method comprises a material different from a material of at least one of the other thermal sprayed coatings.

7. The method according to any one of claims 1 to 5, wherein at least one of the thermal sprayed coatings formed by the method comprises a material identical to a material of at least one of the other thermal sprayed coatings.

8. The method according to any one of claims 1 to 7, wherein the high energy beam is a laser beam and an energy density thereof is $1.0 \times 10^2$-$1.0 \times 10^4$ J/cm$^2$.

* * * * *